(12) United States Patent (10) Patent No.: US 8,454,320 B2
Mandica et al. (45) Date of Patent: Jun. 4, 2013

(54) CONTROL PROCESS FOR A PIEZOELECTRIC PUMP OF AN ELECTRIC HOUSEHOLD APPLIANCE AND AN ELECTRIC HOUSEHOLD APPLIANCE EMPLOYING SUCH A PROCESS

(75) Inventors: Franck Mandica, Francheville le Haut (FR); Bertrand Couet, Loire sur Rhone (FR); Serge Cubizolles, Oytier Saint Oblas (FR); Olivier Lavillat, Quintal (FR)

(73) Assignee: SEB S.A., Ecully (FR)

( * ) Notice: Subject to any disclaimer, the term of this patent is extended or adjusted under 35 U.S.C. 154(b) by 338 days.

(21) Appl. No.: 12/939,268

(22) Filed: Nov. 4, 2010

(65) Prior Publication Data

US 2011/0103977 A1 May 5, 2011

(30) Foreign Application Priority Data

Nov. 4, 2009 (FR) ..................................... 09 05286

(51) Int. Cl.
*F04B 49/02* (2006.01)
*F04B 49/06* (2006.01)
*F04B 17/03* (2006.01)
*D06F 75/02* (2006.01)

(52) U.S. Cl.
USPC .............. 417/12; 417/45; 417/53; 417/413.2; 219/250; 38/82

(58) Field of Classification Search
USPC ........ 417/12, 44.1, 45, 413.2; 219/250; 38/82
See application file for complete search history.

(56) References Cited

U.S. PATENT DOCUMENTS

| 6,164,933 A * | 12/2000 | Tani et al. ................. 417/413.2 |
| 6,416,294 B1 * | 7/2002 | Zengerle et al. ................. 417/53 |
| 2008/0095639 A1 * | 4/2008 | Bartos et al. ............... 417/44.11 |
| 2008/0189951 A1 * | 8/2008 | Molema et al. .................... 30/41 |
| 2009/0010779 A1 * | 1/2009 | Hirata et al. ............... 417/413.2 |

FOREIGN PATENT DOCUMENTS

| EP | 0789146 A1 | 8/1997 |
| WO | 2006100627 A1 | 9/2006 |
| WO | 2009083417 A1 | 7/2009 |
| WO | 2009130407 A1 | 10/2009 |

* cited by examiner

*Primary Examiner* — Charles Freay
(74) *Attorney, Agent, or Firm* — The Webb Law Firm

(57) ABSTRACT

Control process for a piezoelectric pump (100) of an electric household appliance comprising a pump chamber (110) equipped with a mobile wall (111) displaceable under the action of a piezoelectric actuator (111A), characterized in that during a startup phase of the pump (100), the piezoelectric actuator (111A) is supplied during a plurality of alternations with an alternating supply signal having a voltage U bringing about a substantial deformation of the piezoelectric actuator (111A) for a maximum sweeping of the volume of the pump chamber (110) by the mobile wall (111), and further characterized in that the pump startup phase is followed by a normal operation phase during which the supply signal is modified so that the mean flow rate provided by the pump (100) is less than the flow rate provided during the startup phase.

17 Claims, 4 Drawing Sheets

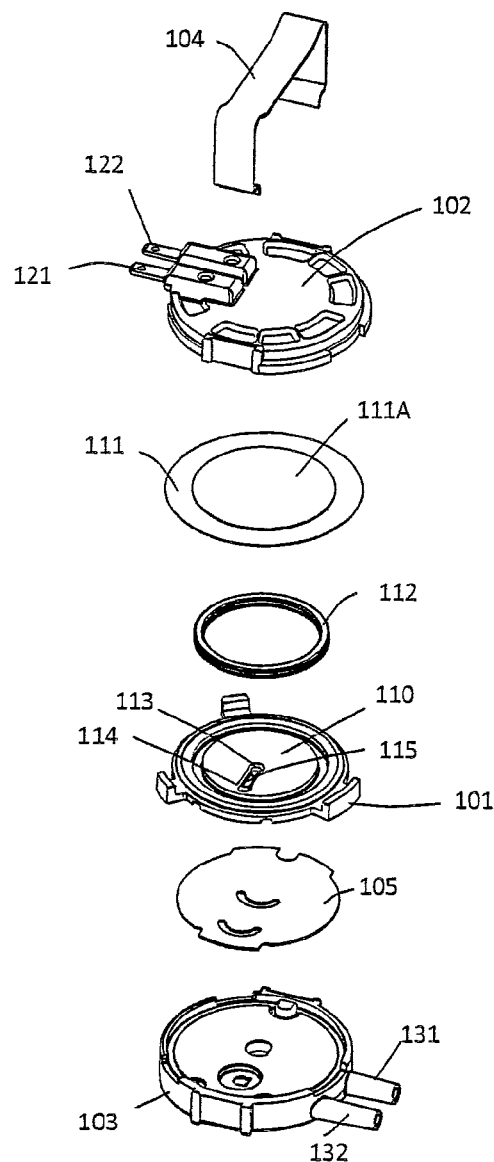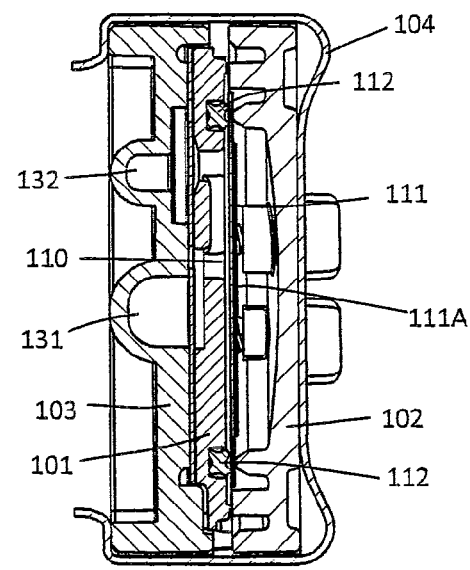
Fig 4
Fig 3 ized by the same reference numbers from one figure to
CONTROL PROCESS FOR A PIEZOELECTRIC PUMP OF AN ELECTRIC HOUSEHOLD APPLIANCE AND AN ELECTRIC HOUSEHOLD APPLIANCE EMPLOYING SUCH A PROCESS

BACKGROUND OF THE INVENTION

1. Field of the Invention

The present invention relates to a control process for a piezoelectric pump of an electric household appliance comprising a pump chamber equipped with a mobile wall displaceable under the action of a piezoelectric actuator, and to an electric household appliance comprising a piezoelectric pump electrically powered by a circuit employing such a control process.

2. Brief Description of the Prior Art

An electric circuit for a piezoelectric pump supplying power to the pump directly, at the frequency of the electric main, is disclosed in French patent #2 929 450 filed by the applicant. Such a supply circuit has the advantage of being dependable and inexpensive to use. However, a disadvantage resides in such a circuit in that it does not enable the pump flow rate to be modulated, in particular reduced.

Reducing the flow rate of the pump by acting upon the voltage on the terminals of the piezoelectric actuator is known to the prior art, wherein a reduction of the voltage makes it possible to obtain a lesser deformation of the piezoelectric actuator and hence a reduction of the volume swept by the mobile wall during an alternation of the electric signal. However, a disadvantage resides in the reduction of the voltage in that it reduces the pump compression rate, i.e., the ratio between the volume swept by the mobile wall and the dead volume of the pump chamber. Lowering the pump compression rate below a predetermined threshold leads to problems in the auto-priming of the pump and/or in the expulsion of air bubbles present in the pump chamber.

Reducing the flow rate of a piezoelectric pump by lowering the frequency of the electric signal on the terminals of the piezoelectric actuator in such a way that a lesser volume is swept by the mobile wall within a given time period is likewise known to the prior art. However, a disadvantage resides in such a solution in that it requires a frequency modulation circuit, which is relatively expensive to manufacture. Furthermore, lowering the frequency of the supply signal also has the disadvantage of reducing the displacement speed of the mobile wall to a rate that is no longer adequate for the proper expulsion of any air bubbles present in the pump chamber.

SUMMARY OF THE INVENTION

Hence an object of the present invention is to remedy these disadvantages by proposing a control process enabling a piezoelectric pump of an electric household appliance to operate at a reduced flow rate relative to the flow rate normally provided by the pump without encountering auto-priming and air bubble expulsion problems.

To this end, the object of the invention is a control process for a piezoelectric pump of an electric household appliance comprising a pump chamber equipped with a mobile wall displaceable under the action of a piezoelectric actuator, characterized in that during a pump startup phase, the piezoelectric actuator is supplied during a plurality of alternations with an alternating supply signal having a voltage U generating a substantial deformation of the piezoelectric actuator to bring about a maximum sweeping of the volume of the pump chamber by the mobile wall, and further characterized in that the pump startup phase is followed by a normal operation phase during which the supply signal is modified so that the average flow rate provided by the pump is lower than the flow rate provided during the startup phase.

According to still another characteristic of the invention, the startup phase corresponds to a predetermined operation time $t_0$.

According to still another characteristic of the invention, the voltage U of the supply signal during the normal operation phase is lowered relative to the voltage U of the supply signal used during the startup phase.

According to still another characteristic of the invention, the frequency of the supply signal is weaker during the normal operation phase than during the startup phase.

According to another characteristic of the invention, the supply signal during the normal operation phase corresponds to the periodically chopped signal of the startup phase.

The invention also relates to an electric household appliance comprising a piezoelectric pump powered from the household electric main, the piezoelectric pump comprising a pump chamber equipped with a mobile wall displaceable under the action of a piezoelectric actuator, the actuator being powered by a supply circuit generating an alternating supply signal bringing about a periodic displacement of the mobile wall, characterized in that the power supply circuit of the pump employs the control process described previously.

According to another characteristic of the invention, the supply circuit comprises means for reducing amplitude of the voltage of the supply signal after a pump startup phase.

According to another characteristic of the invention, the pump supply circuit comprises a device for chopping the supply signal in such a way that the supply voltage is only applied in certain alternations.

According to another characteristic of the invention, the supply signal is asymmetric.

According to still another characteristic of the invention, the supply signal possesses only positive alternations.

According to another characteristic of the invention, the electric appliance is a pressing device, such as a clothing iron or a clothing steamer.

According to a variant of the invention, the electric appliance is a hairstyling device such as a hair straightener.

BRIEF DESCRIPTION OF THE DRAWINGS

The objectives, aspects, and advantages of the present invention will emerge more clearly from the following description of an illustrative embodiment of the invention, which is provided as a non-limiting example, with reference to the appended drawings, wherein:

FIG. 3 is an exploded perspective view of the pump with which the iron of FIGS. 1 and 2 is equipped;

FIG. 4 is a cutaway view of the pump of FIG. 3;

DETAILED DESCRIPTION OF THE INVENTION

Only the elements necessary for understanding the invention are shown. To make the drawings easier to read, the same elements have the same reference numbers from one figure to another.

Figure 1:
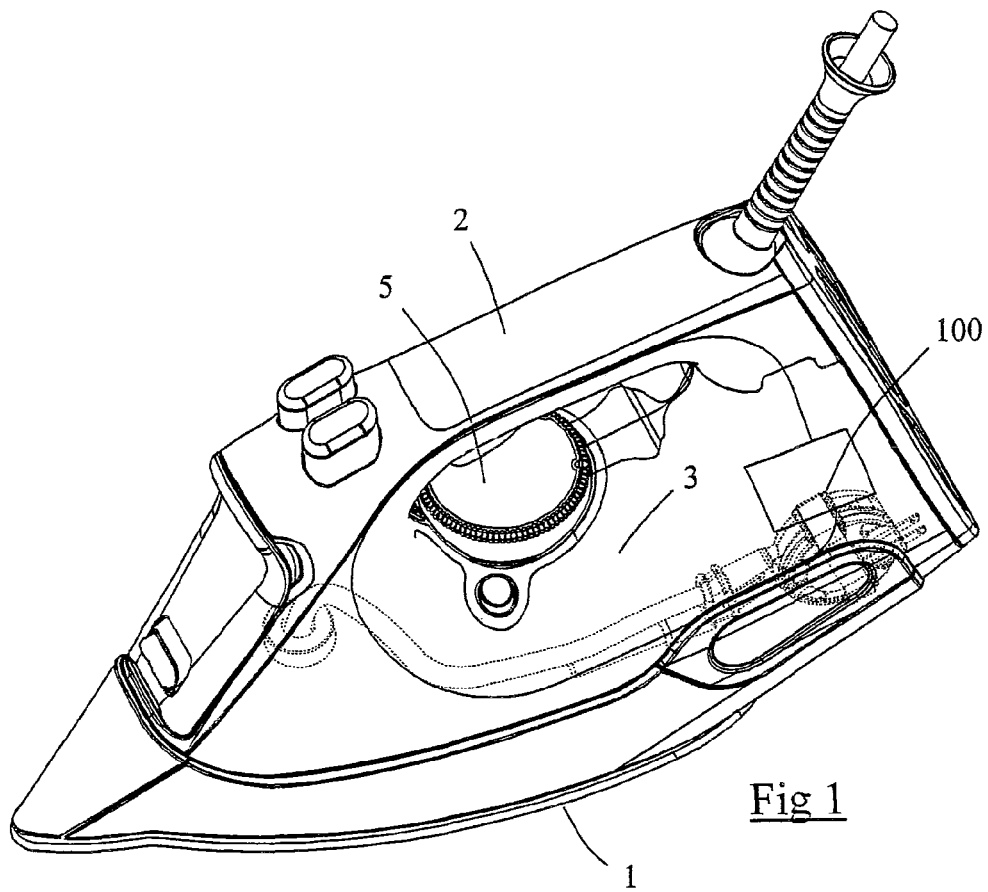
FIG. 1 is a perspective view of an iron employing the control process of the invention.

FIG. 1 shows a clothing iron comprising a pressing sole 1 surmounted by a body comprising a handle 2 and a control knob 5 of a thermostat for controlling the temperature of the sole 1, the body enclosing a water tank 3 and a piezoelectric pump 100, the operation of which is controlled by means of a control trigger disposed under the handle 2, which is not visible in the figures.

Figure 2:
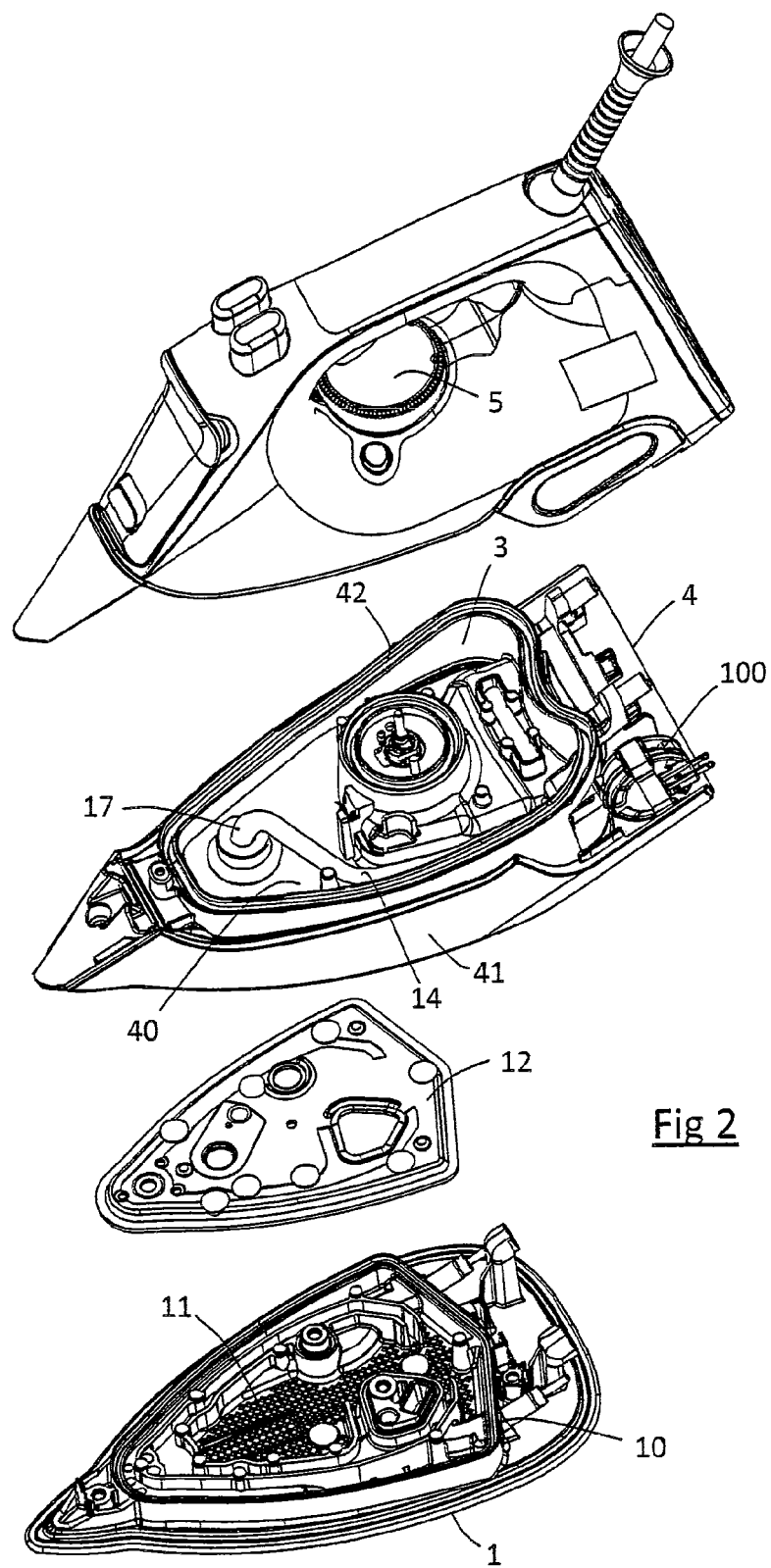
FIG. 2 is a partially exploded perspective view of the iron of FIG. 1.

According to FIG. 2, which is an exploded view of the iron, the sole 1 of the iron is in thermal contact with a heating element 10 which integrates, in a manner known per se, a vaporization chamber 11 for generating steam, said vaporization chamber being closed by a lid 12 and connected to a steam dispensing circuit comprising steam exit holes bored in the sole 1.

In order to restrict the diffusion of heat of the iron handle 2, the heating element 10 is surmounted by a heat screen 4 comprising a central portion 40 delimiting the bottom of the tank 3 and a peripheral portion constituting a protective skirt 41 extending under the bottom of the tank 3, matching the shape of the sole 1 in such a way as to laterally border the heating element 10.

The heat screen 4 also bears the piezoelectric pump 100, the latter being disposed outside the tank 3 and connected to a suction line opening in the bottom of the tank, which is visible in FIG. 1, and to a discharge line running through an aperture of the lid located on top of the vaporization chamber 11.

In this manner the water suctioned from the tank 3 by the pump 100 is conducted directly into the vaporization chamber 11, the steam thus generated having a flow rate directly proportional to the flow rate of the pump.

According to FIGS. 3 and 4, the piezoelectric pump 100, which is described in more detail in French patent #08 06960, comprises a pump chamber 110 laterally delimited by a gasket 112 disposed between a polyamide base 101 and a mobile wall 111. The mobile wall 111 is constituted by a brass membrane comprising an outer surface oriented to the exterior of the pump chamber 110 and on which is attached a ceramic piezoelectric actuator 111A. The mobile wall 111 is held against the gasket 112 by means of an elastic clip 104, which engages with a lid 102 and a collar 103 disposed on either side of the base 101.

The collar 103 comprises a suction line 131 opening into the pump chamber 110 via an inlet opening 113 disposed in the center of the pump chamber 110 in such a way that it is located opposite the zone of maximum displacement of the mobile wall 111, where the depression is greatest.

The collar further comprises a discharge line 132 opening into the pump chamber 110 via an outlet opening 114 disposed in proximity to the periphery of the pump chamber 110, the pump 100 being vertically positioned in the iron in such a way that the outlet opening 114 is located at the top of the pump chamber 110 with the iron flatly resting on its sole 1. A silicone film 105 is interposed between the base 101 and the collar 103, forming valves for the inlet opening 113 and for the outlet opening 114.

In order to facilitate the expulsion of any air bubbles present in the pump chamber 101, the latter comprises a groove 115 with a depth of around 1 mm and extending between the inlet 113 and outlet 114 openings on the surface of the base 101 facing the lid 102; this groove 115 enables the air bubbles to be channeled towards the outlet opening.

The lid 102 of the pump comprises supply terminals 121, 122 electrically connected to the mobile wall 111 and to the piezoelectric actuator 111A, wherein these terminals 121, 122 are supplied with an alternating voltage bringing about a periodic deformation of the piezoelectric actuator 111A and of the mobile wall 111, which is flexible in either direction in order to increase and then decrease the volume of the pump chamber 110.

Figure 5:
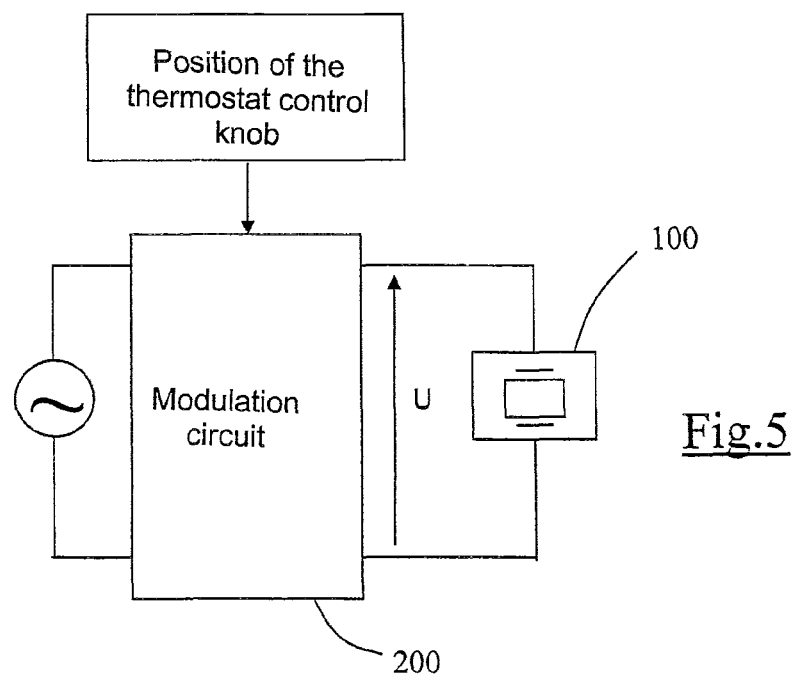
FIG. 5 is a schematic illustration of the circuit supplying power to the pump of FIG. 4.

According to FIG. 5, the iron comprises a supply circuit for the piezoelectric pump 100 consisting of a modulation circuit 200 for modifying the alternating signal provided by the household electric main. This modulation circuit 200 advantageously receives information on the position of the thermostat control knob 5 in such a manner that the flow rate of the pump 100 is adjusted according to the set temperature of the sole 1. For example, the pump 100 will be set to provide a steam flow rate of around 40 g/min when the thermostat is set to obtain a sole temperature of around 200° C., and to provide a steam flow rate of 10 g/min when the thermostat is set to obtain a sole temperature of around 110° C.

More particularly according to the invention, the supply circuit of the piezoelectric pump 100 provides, independently of the desired flow rate, a supply signal having a sufficiently high alternating voltage during a pump startup phase to bring about a maximum sweeping of the volume of the pump chamber 110 by the mobile wall 111. This supply signal is then modified during a normal operation phase subsequent to the pump startup phase in such a manner as to make the flow rate of the pump correspond to the desired flow rate.

Preference is given to the transition from the startup phase to the normal operation phase taking place after a microcontroller counts down a predetermined operation time $t_0$ corresponding to a plurality of alternations of the supply signal of the pump 100. For example, the interval $t_0$ may be around 100 msec for an alternating supply signal with a frequency of around 50 Hz.

A substantial sweeping of the pump chamber 110 by the mobile wall 111 during the startup of the pump is thus obtained, wherein the dead volume in the pump chamber 110 is essentially reduced to the groove 115. Hence the water circulating in the pump 110 during the startup phase mainly circulates in the groove 115 connecting the inlet opening 113 and the outlet opening 114, making it possible to obtain a very high circulating speed for expelling bubbles and priming the pump 100.

Figure 6A:
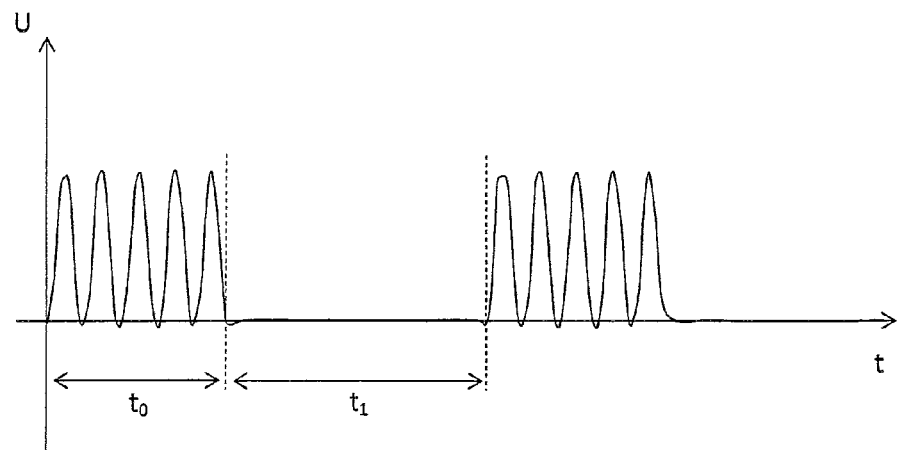
FIGS. 6A, 6B, and 6C represent the pump supply signal according to different variants of embodiment of the control process of the invention.

As an example, and as illustrated in FIG. 6A, during the startup phase the piezoelectric actuator 111A is supplied with an alternating voltage U with a frequency of 50 Hz and an amplitude of around 230 V. Preference is given to this voltage being asymmetric in order to prevent depolarization of the piezoelectric actuator.

After an interval $t_0$ of 100 msec, the supply signal is periodically chopped by the supply circuit in such a way as to momentarily stop the activation of the mobile wall 111 in order to reduce the flow rate of the pump 100. In the example illustrated, the supply signal is chopped; it is interrupted for a period of $t_0$ of 140 msec and is then once again similar to the signal of the startup phase for a period of 100 msec. By an intermittent operation of the pump 100, a reduction of the flow rate on the order of $t_1/(t_1+t_0)$, or ca. 60%, is thus obtained. Obviously the time during which the signal is chopped will depend on the desired flow rate, the mean flow rate diminishing as the interval $t_1$ increases.

Figure 6B:
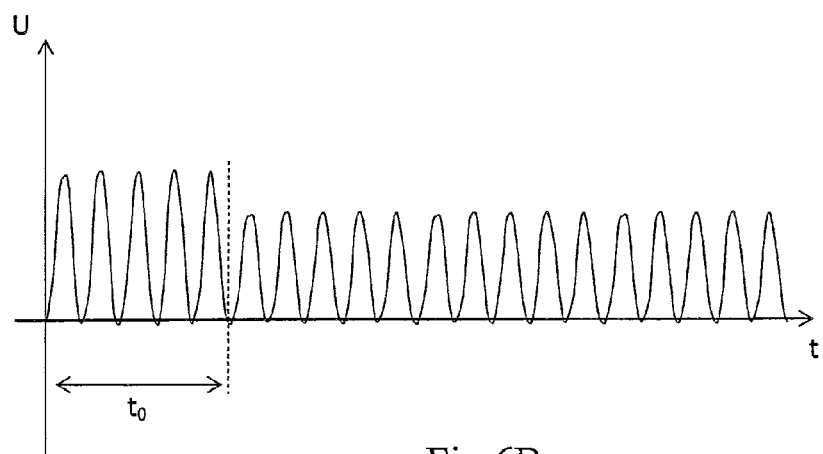

In a variant of embodiment of the invention shown in FIG. 6B, the piezoelectric pump 100 is supplied during a startup phase $t_0$ with a supply signal similar to the one described in the previous illustrative embodiment, and is then supplied with a signal of which the voltage U is reduced in such a manner that the piezoelectric actuator 111A is deformed to a lesser extent during a signal alternation, thereby reducing the volume swept by the mobile wall 111. An operation of the pump at a reduced flow rate is thus obtained after an interval $t_0$ of 100 msec, wherein maintaining a signal brings about a maximum sweeping of the volume of the pump chamber during the startup phase, thus ensuring an effective auto-priming of the pump as well as the expulsion of any air bubbles. Such a mode of embodiment has the advantage of being simple and cost effective to employ, as the lowering of the supply voltage U by the supply circuit is achievable by using inexpensive components.

Figure 6C:
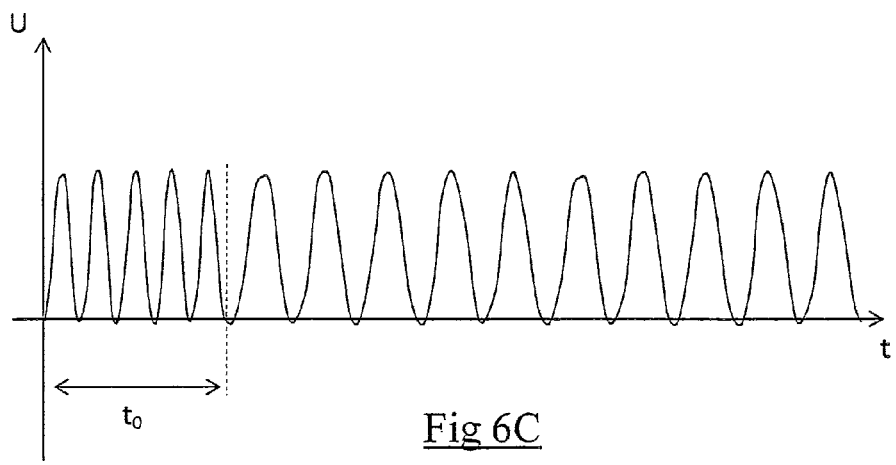

In another variant of embodiment illustrated in FIG. 6C, the piezoelectric pump 100 is always supplied during a startup phase $t_0$ with a supply signal similar to the one described in the first illustrative embodiment, and then the flow rate of the pump is reduced by reducing the frequency of the supply signal of the pump. Such a variant of embodiment, however, has the disadvantage of being more expensive to employ.

Hence the pump control process thus described makes it possible to obtain a reliable and efficient operation of the pump at a low flow rate by optimizing the pump supply signal for a few milliseconds in a first time period when starting the pump in order to optimize the conditions for auto-priming and expelling any air bubbles, and then by modifying the pump supply signal during a second time period in order to reduce the flow rate of the pump in such a manner as to approach the desired flow rate, wherein this reduction in flow rate is achieved with the pump already primed and any air bubbles, which could otherwise pose problems in the case of an operation with fewer actuations of the mobile wall, already expelled.

In the clothing iron thus configured, it is thus possible to control the flow rate of the pump in order to adapt it to the ironing conditions; this modification of the pump flow rate is achievable either automatically relative to the set temperature of the sole or manually by providing a knob on the iron for adjusting the desired quantity of steam.

Obviously the invention is in no way limited to the mode of embodiment described and illustrated herein, which was merely provided as an example. Modifications are possible, notably in terms of the constitution of the various elements or by substituting equivalent techniques, without in any way exceeding the scope of protection of the invention.

In a variant of embodiment of the invention, it is therefore possible to modify the shape of the pump chamber or the means of assembling the pump elements.

The invention claimed is:

1. Control process for a piezoelectric pump of an electric household appliance comprising a pump chamber equipped with a mobile wall displaceable under the action of a piezoelectric actuator, characterized in that during a startup phase of the pump, the piezoelectric actuator is supplied during a plurality of alternations with an alternating supply signal with a voltage U bringing about a substantial deformation of the piezoelectric actuator for a maximum sweeping of the volume of the pump chamber by the mobile wall, and further characterized in that the startup phase of the pump is followed by a normal operation phase during which the supply signal is modified so that the mean flow rate provided by the pump is lower than the flow rate provided during the startup phase.

2. Control process for a piezoelectric pump as in claim 1, wherein the startup phase corresponds to a predetermined operation time $t_0$.

3. Control process for a piezoelectric pump as in claim 1, wherein the voltage U of the supply signal during the normal operation phase is lowered relative to the voltage U of the supply signal used during the startup phase.

4. Control process for a piezoelectric pump as in claim 1, wherein the frequency of the supply signal during the normal operation phase is lower than during the startup phase.

5. Control process for a piezoelectric pump as in claim 1, wherein the supply signal during the normal operation phase corresponds to the periodically chopped supply signal of the startup phase.

6. Electric household appliance comprising a piezoelectric pump supplied with power from the household electric main, the piezoelectric pump comprising a pump chamber equipped with a mobile wall displaceable under the action of a piezoelectric actuator, said actuator being powered by a supply circuit generating an alternating supply signal bringing about a periodic displacement of the mobile wall wherein said pump supply circuit employs the control process as in claim 1.

7. Electric household appliance as in claim 6, wherein the supply circuit comprises means for reducing the amplitude of the voltage of the supply signal after a startup phase of the pump.

8. Electric household appliance as in claim 6, wherein the supply circuit of the pump comprises a device for chopping the supply signal in such a manner that the supply voltage is only applied in certain alternations.

9. Electric household appliance as in claim 6, wherein the supply signal is asymmetric.

10. Electric household appliance as in claim 9, wherein the supply signal has only positive alternations.

11. Electric household appliance as in claim 6, wherein said electric household appliance is a pressing device.

12. Electric household appliance as in claim 6, wherein said electric household appliance is a hairstyling device.

13. Electric household appliance as in claim 7, wherein said electric household appliance is a pressing device.

14. Electric household appliance as in claim 8, wherein said electric household appliance is a pressing device.

15. Electric household appliance as in claim 9, wherein said electric household appliance is a pressing device.

16. Electric household appliance as in claim 10, wherein said electric household appliance is a pressing device.

17. Electric household appliance as in claim 6, wherein the electric household appliance is selected from the group consisting of a clothing iron, a clothing steamer, and a hair straightener.

* * * * *